(12) United States Patent
Lee et al.

(10) Patent No.: US 7,545,199 B2
(45) Date of Patent: Jun. 9, 2009

(54) POWER SUPPLY CIRCUIT FOR OSCILLATOR OF SEMICONDUCTOR MEMORY DEVICE AND VOLTAGE PUMPING DEVICE USING THE SAME

(75) Inventors: Kang Seol Lee, Seoul (KR); Yong Mi Kim, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 65 days.

(21) Appl. No.: 10/980,408

(22) Filed: Nov. 3, 2004

(65) Prior Publication Data

US 2005/0168265 A1 Aug. 4, 2005

(30) Foreign Application Priority Data

Feb. 4, 2004 (KR) .................. 10-2004-0007347

(51) Int. Cl.
*G11C 5/14* (2006.01)
(52) U.S. Cl. ................... 327/530; 327/538; 331/57
(58) Field of Classification Search ............... 327/530, 327/532, 535, 538, 540, 541, 543, 544, 545, 327/546, 536, 143, 198; 331/15, 57
See application file for complete search history.

(56) References Cited

U.S. PATENT DOCUMENTS

| | | | | |
|---|---|---|---|---|
| 4,717,840 A * | 1/1988 | Ouyang et al. | ........ | 327/143 |
| 4,839,787 A * | 6/1989 | Kojima et al. | ........ | 363/60 |
| 4,847,518 A * | 7/1989 | Leidich | ........ | 327/541 |
| 5,072,197 A * | 12/1991 | Anderson | ........ | 331/57 |
| 5,180,926 A * | 1/1993 | Skripek | ........ | 327/143 |
| 5,253,205 A * | 10/1993 | Eaton, Jr. | ........ | 365/189.06 |
| 5,278,460 A * | 1/1994 | Casper | ........ | 327/546 |
| 5,349,244 A * | 9/1994 | Confalonieri | ........ | 327/143 |
| 5,376,840 A * | 12/1994 | Nakayama | ........ | 327/537 |
| 5,751,142 A * | 5/1998 | Dosho et al. | ........ | 323/316 |
| 5,754,418 A | 5/1998 | Park et al. | | |
| 5,809,312 A * | 9/1998 | Ansel et al. | ........ | 713/300 |
| 5,859,560 A * | 1/1999 | Matthews | ........ | 327/513 |
| 5,892,390 A * | 4/1999 | Tobita | ........ | 327/543 |
| 5,989,327 A * | 11/1999 | Ryu et al. | ........ | 106/31.85 |
| 6,133,779 A * | 10/2000 | Sichert et al. | ........ | 327/540 |
| 6,188,395 B1 * | 2/2001 | Yatabe | ........ | 345/211 |
| 6,265,858 B1 * | 7/2001 | Park | ........ | 323/313 |
| 6,288,963 B1 * | 9/2001 | Kato | ........ | 385/222 |
| 6,323,721 B1 * | 11/2001 | Proebsting | ........ | 327/535 |
| 6,333,873 B1 | 12/2001 | Kumanoya et al. | | |

(Continued)

*Primary Examiner*—Lincoln Donovan
*Assistant Examiner*—Thomas J Hiltunen
(74) *Attorney, Agent, or Firm*—Marshall, Gerstein & Borun LLP

(57) ABSTRACT

Disclosed are a power supply circuit for an oscillator of a semiconductor memory device and a voltage pumping device using the same. In the power supply circuit, a voltage divider divides a voltage between an external power supply and ground. A driver is controlled by a signal of the voltage divided by the voltage divider. The driver supplies an internal power supply voltage. A capacitor is coupled between the driver and the ground. As the level of an external power supply voltage is increased, a relatively low voltage is supplied to the oscillator to increase a cycle length of an output pulse signal of the oscillator. Therefore, an excessive increase in the internal power supply voltage due to over-pumping can be avoided and noise occurrence and electric current consumption can be reduced.

14 Claims, 4 Drawing Sheets

U.S. PATENT DOCUMENTS

| | | | |
|---|---|---|---|
| 6,462,625 B2* | 10/2002 | Kim | 331/57 |
| 6,501,467 B2* | 12/2002 | Miyazaki | 345/210 |
| 6,518,846 B2* | 2/2003 | Ichihara | 331/57 |
| 6,650,191 B2* | 11/2003 | Branch et al. | 331/57 |
| 6,759,857 B2* | 7/2004 | Kong et al. | 324/752 |
| 7,015,766 B1* | 3/2006 | Guo et al. | 331/176 |
| 7,030,707 B2* | 4/2006 | Lee et al. | 331/143 |
| 2001/0026187 A1* | 10/2001 | Oku | 327/536 |
| 2002/0167350 A1* | 11/2002 | Sato et al. | 327/540 |
| 2002/0190798 A1* | 12/2002 | Kozaki | 331/57 |
| 2003/0006832 A1* | 1/2003 | Ikehashi et al. | 327/541 |
| 2003/0052661 A1* | 3/2003 | Tachimori | 323/313 |
| 2003/0227321 A1* | 12/2003 | Kim et al. | 327/536 |
| 2004/0036526 A1* | 2/2004 | Lee | 327/544 |

* cited by examiner

POWER SUPPLY CIRCUIT FOR OSCILLATOR OF SEMICONDUCTOR MEMORY DEVICE AND VOLTAGE PUMPING DEVICE USING THE SAME

This application relies for priority upon Korean Patent Application No. 2004-0007347 filed on Feb. 2, 2004, the contents of which are herein incorporated by reference in their entirety.

BACKGROUND OF THE INVENTION

1. Field of the Invention

The present invention relates to a power supply circuit for an oscillator of a semiconductor memory device and a voltage pumping device using the same, and more particularly to a power supply circuit for an oscillator and a voltage pumping device using the same that can increase a cycle length of an output pulse signal from the oscillator by supplying a relatively low voltage to the oscillator as the level of an external power supply voltage is increased.

2. Description of the Related Art

Conventionally, a Dynamic Random Access Memory (DRAM) is a random access memory capable of writing data to a memory cell consisting of one transistor and one capacitor or reading data from the memory cell. Because the DRAM employs an N-Channel Metal Oxide Semiconductor (NMOS) transistor as a transistor configuring the memory cell, a voltage pumping device for driving a word line is used which takes into account voltage loss due to a threshold voltage Vt to generate a sum of an external power supply voltage Vdd, the threshold voltage Vt and a voltage difference AV.

A voltage that is the threshold voltage Vt higher than a source voltage must be applied to a gate of the NMOS transistor so that the NMOS transistor mainly used in the DRAM cell can be turned on. In order that the voltage of a full Vdd level can be read from the cell or bit line or can be written to the cell or bit line because a level of the maximum voltage applied to the DRAM is typically a Vdd level, a raised voltage equal to or higher than the voltage Vdd+Vt must be applied to the gate of the NMOS transistor. Thus, in order for a word line of the DRAM device to be driven a need exists for a voltage pumping device generating the raised voltage, i.e., a high voltage Vpp.

FIG. 1 is a block diagram illustrating a conventional voltage pumping device.

The conventional voltage pumping device includes a high-voltage level detector 100 for detecting a high voltage (Vpp) level signal fed back from a high-voltage pump 400 and generating a high-voltage pumping enable signal ppe; an oscillator 200 for generating a predetermined pulse signal osc1 in response to the high-voltage pumping enable signal ppe; a pump controller 300 for outputting pump drive control signals in response to the pulse signal osc1 applied from the oscillator 200; and the high-voltage pump 400 for pumping the high voltage Vpp with a predetermined voltage level in response to the pump drive control signals.

According to the above-described constitution, the voltage pumping device generates the high voltage Vpp.

Operation of the voltage pumping device will be described in detail with reference to FIG. 2.

First, when the high-voltage level detector 100 detects the high voltage (Vpp) level signal fed back from the high-voltage pump 400 and generates the high-voltage enable signal ppe, the oscillator 200 generates the predetermined pulse signal osc1 in response to the high-voltage pumping enable signal ppe. Subsequently, the pump controller 300 generates the pump drive control signals p1, p2, g1 and g2 in response to the pulse signal osc1 applied from the oscillator 200. Subsequently, the high-voltage pump 400 performs an operation for pumping the high voltage Vpp with the predetermined voltage level in response to the pump drive control signals p1, p2, g1 and g2.

The pump drive control signals p1 and p2 are inputted into input terminals of capacitors C1 and C2, respectively. The pump drive control signals g1 and g2 are inputted into input terminals of capacitors C3 and C4, respectively. When the input terminal of the capacitor C3 is coupled to a high level signal by the pump drive control signal g1, an NMOS transistor N100 is turned on and a node A is driven at an external power supply voltage Vdd. Subsequently, when the voltage of an input node of the capacitor C1 is switched from a ground voltage to the external power supply voltage Vdd by the pump drive control signal p1, the voltage of the node A is raised to "2×Vdd" by the capacitor C1.

Subsequently, as the pump drive control signal p2 is a low level signal and the pump drive control signal g2 is a Vdd level signal, an NMOS transistor N200 is turned on and a node B is driven at the external power supply voltage Vdd. Since the node B driven at the external power supply voltage Vdd is coupled to a gate of a P-Channel Metal Oxide Semiconductor (PMOS) transistor P100, a voltage difference between the node A held at the voltage 2×Vdd and the node B held at the external power supply voltage Vdd is equal to or greater than the threshold voltage Vt. Thus, the PMOS transistor P100 is turned on and then transfers the voltage 2×Vdd to the high-voltage (Vpp) node.

Subsequently, when the pump drive control signal p2 is a Vdd level signal and the pump drive control signal p1 is a low level signal, operation of the node B is as follows. The voltage 2×Vdd is transferred from the node B to the high-voltage (Vpp) node. Consequently, the voltage pumping device repeats the above-described operation and continuously performs a pumping operation so that the high-voltage (Vpp) level can reach a targeted level and the targeted level can be maintained.

However, the oscillator 200 supplying the pulse signal osc1 to the pump controller 300 typically uses the external power supply voltage as a source voltage for a chain of inverters IN1 to IN6. Thus, when the external power supply voltage Vdd is increased, there is a problem in that device operation characteristics maybe degraded.

That is, when a power supply voltage is increased, an operating rate of the chain of inverters IN1 to IN6 constituting the oscillator 200 is increased. If the external power supply voltage Vdd supplied to the inverters IN1 to IN6 is increased, the operating rate is increased. Thus, a cycle length of the clock signal osc1 oscillated by the oscillator 200 constituted by the inverters IN1 to IN6 is reduced (refer to FIG. 8). In response to the pump drive control signals p1, p2, g1 and g2 generated from the pump controller 300 receiving the clock signal osc1 with the reduced cycle length, the high-voltage pump 400 performs the above-described voltage pumping operation. However, as the cycle length of the clock signal osc1 is reduced in the conventional voltage pumping device, an amount of voltage to be pumped at one time is excessive. For this reason, there is a problem in that unnecessary noise occurs and then electric current consumption is increased.

SUMMARY OF THE INVENTION

Therefore, the present invention has been made in view of the above problems, and it is an object of the present invention to provide a power supply circuit for an oscillator and a voltage pumping device using the same that can avoid an excessive increase in an internal power supply voltage due to over-pumping and reduce noise occurrence by supplying a relatively low voltage to an oscillator to increase a cycle length of an output pulse signal of the oscillator as a level of an external power supply voltage is increased.

In accordance with one aspect of the present invention, the above and other objects can be accomplished by the provision of a power supply circuit for an oscillator, comprising: a voltage divider for dividing a voltage between an external power supply and ground; a driver controlled by a signal of the voltage divided by the voltage divider, the driver supplying an internal power supply voltage; and a capacitor coupled between the driver and the ground.

Preferably, the driver is a P-channel Metal Oxide Semiconductor (PMOS) transistor.

Preferably, a power supply voltage for the oscillator driven by the driver is supplied as a source voltage for a chain of inverters arranged within the oscillator.

Preferably, a level of the voltage supplied by the power supply circuit for the oscillator is based on a magnitude of a voltage charged in the capacitor according to the internal power supply voltage driven by the driver.

Preferably, the voltage divider comprises a first resistance component and a second resistance component coupled between the external power supply and the ground.

Preferably, the voltage divider further comprises a first diode and a second diode coupled between the external power supply and the ground.

Preferably, the first diode is a PMOS diode and the second diode is an N-channel Metal Oxide Semiconductor (NMOS) diode.

Preferably, the first diode is a first NMOS diode and the second diode is a second NMOS diode.

Preferably, the first diode is a first PMOS diode and the second diode is a second PMOS diode.

In accordance with another aspect of the present invention, the above and other objects can be accomplished by the provision of a voltage pumping device, comprising: a power supply circuit for outputting a voltage signal charged in a capacitor by an internal power supply voltage, the internal power supply voltage being driven in response to a signal generated by dividing an external power supply voltage; an oscillator for receiving the voltage signal as a source voltage and being operated in response to a high-voltage pumping enable signal; a pump controller for outputting pump drive control signals according to a pulse signal applied from the oscillator; and a high-voltage pump for pumping a voltage with a predetermined voltage level according to the pump drive control signals.

Preferably, the power supply circuit comprises: a voltage divider for dividing a voltage between the external power supply and ground; a driver controlled by a signal of the voltage divided by the voltage divider, the driver supplying the internal power supply voltage; and a capacitor coupled between the driver and the ground.

Preferably, the driver provided in the power supply circuit is a P-channel Metal Oxide Semiconductor (PMOS) transistor.

Preferably, a level of the voltage supplied by the power supply circuit for the oscillator is based on a magnitude of a voltage charged in the capacitor according to the internal power supply voltage driven by the driver.

Preferably, the voltage divider comprises a first resistance component and a second resistance component coupled between the external power supply and the ground.

Preferably, the voltage divider further comprises a first diode and a second diode coupled between the external power supply and the ground.

Preferably, the first diode is a PMOS diode and the second diode is an N-channel Metal Oxide Semiconductor (NMOS) diode.

Preferably, the first diode is a first NMOS diode and the second diode is a second NMOS diode.

Preferably, the first diode is a first PMOS diode and the second diode is a second PMOS diode.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
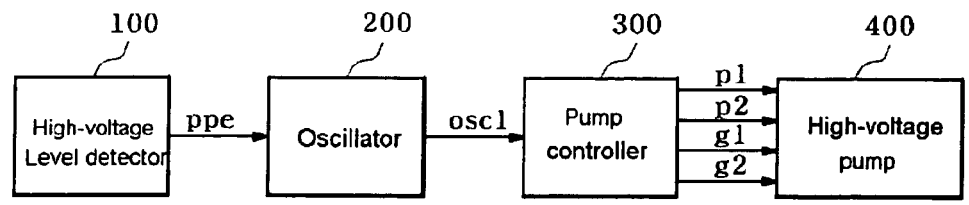
FIG. 1 is a block diagram illustrating a conventional voltage pumping device.
Figure 2:
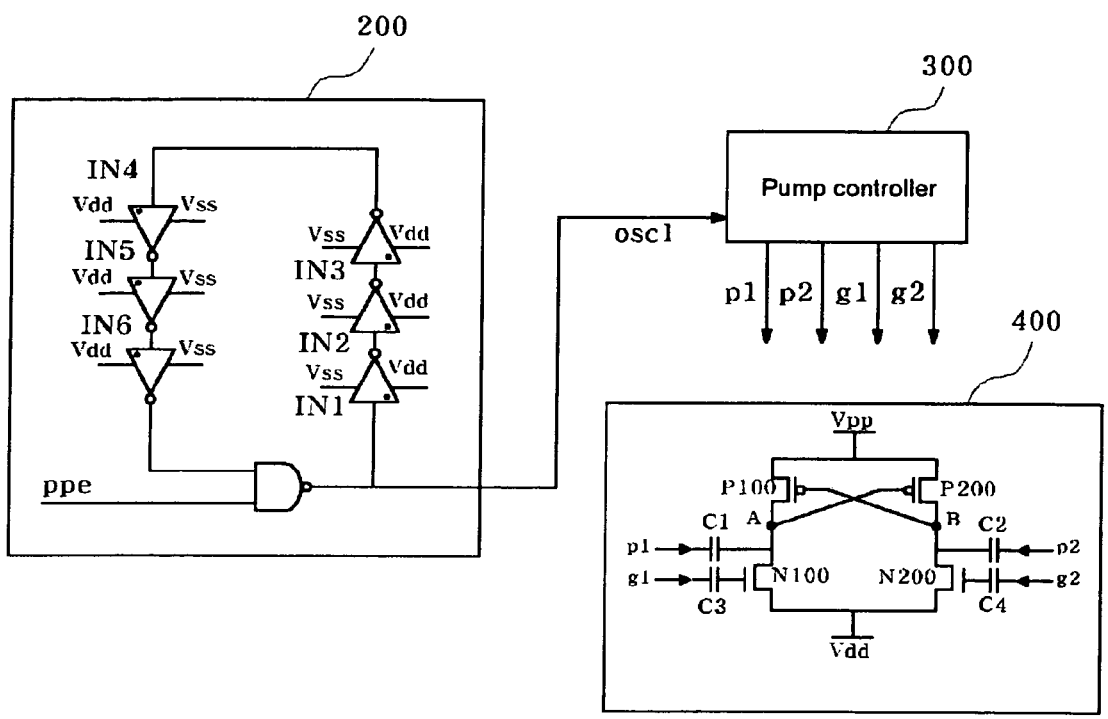
FIG. 2 is a circuit diagram illustrating the conventional voltage pumping device.

First, operation of a power supply circuit for an oscillator will be described in detail. The power supply circuit for the oscillator is a circuit that supplies a voltage Vpup controlled by the magnitude of an external power supply voltage Vdd to the oscillator, i.e., each inverter provided in a chain of inverters.

When the external power supply voltage Vdd is applied to the power supply circuit, a Vdd voltage signal is divided by a voltage divider that divides a voltage between an external power supply and ground. The divided voltage signal is supplied to a driver that supplies an internal power supply voltage Vperi with a predetermined voltage level, and more particularly to a gate of a P-channel Metal Oxide Semiconductor (PMOS) transistor. If the Vdd value is increased, a voltage level of the divided voltage signal is increased. Moreover, the increased voltage signal causes the gate of the driver (or PMOS transistor) to be less opened, such that an amount of charge supplied via the driver from the internal power supply voltage is reduced.

Subsequently, the reduced amount of charge is supplied and charged in the capacitor. The charged voltage of the capacitor is reduced according to the reduced amount of charge, and the power supply circuit for the oscillator can supply the reduced charge voltage of the capacitor as a source voltage to the oscillator. Consequently, as a level of the external power supply voltage Vdd is increased, the power supply circuit for the oscillator can supply a low charge voltage to the oscillator 200.

Next, operation of a voltage pumping device using a power supply circuit for the oscillator in accordance with the present invention will be described.

In the voltage pumping device in accordance with the present invention, the oscillator receives a voltage reduced according to the increased Vdd value serving as a source voltage using the power supply device for the oscillator. Subsequently, the oscillator generates a pulse signal with a predetermined cycle length in response to a high-voltage pumping enable signal. In this case, when a power supply voltage is reduced, an operating rate of a chain of inverters is reduced. As the external power supply voltage Vdd is increased, the oscillator generates a pulse signal with an increased cycle length.

A pump controller generates pump drive control signals in response to the pulse signal applied from the oscillator, and supplies the generated pump drive control signals to a high-voltage pump. The high-voltage pump performs a function for pumping a high voltage with a predetermined voltage level in response to the pump drive control signals. As the cycle length of the pulse signal is increased, the amount of voltage to be pumped at one time is reduced. Even though a Vdd voltage is increased, a stable pumping operation can be performed.

That is, even though the external power supply voltage Vdd is increased, a high-voltage pumping operation can be stably performed by the pulse signal with the increased cycle length and the pump drive control signals based on the pulse signal in accordance with the present invention. Average current consumption can be reduced according to the increased cycle length. As an amount of voltage, to be pumped at one time is reduced, the effects of noise can be avoided.

Now, preferred embodiments in accordance with the present invention will be described in detail with reference to the annexed drawing. The preferred embodiments of the present invention have been disclosed for illustrative purposes. The scope of the present invention is not limited by the embodiments. In the drawings, the same or similar elements are denoted by the same reference numerals even though they are depicted in different drawings.

Figure 3:
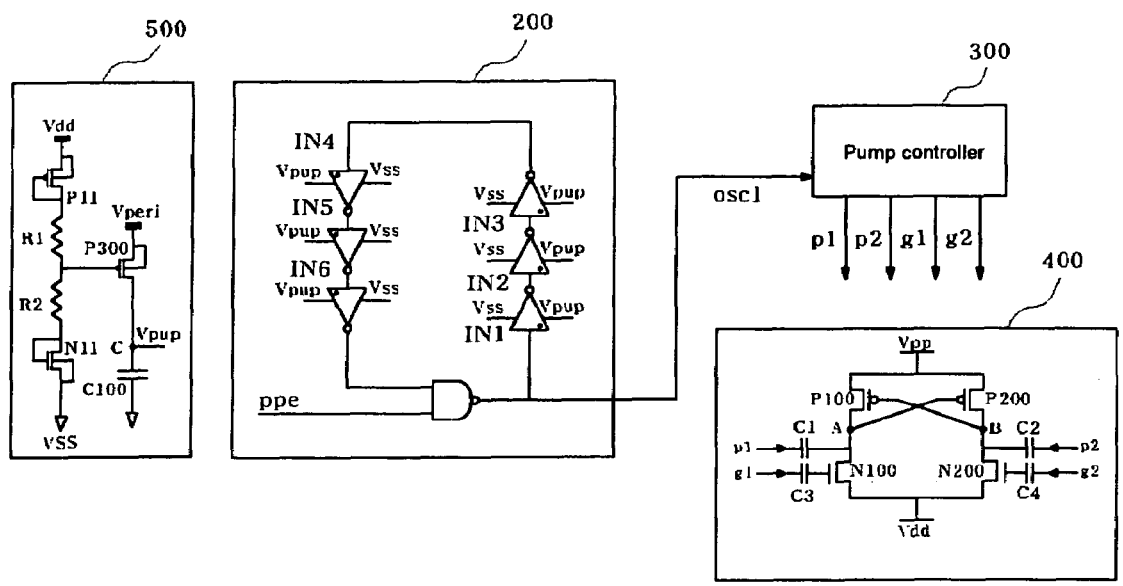
FIG. 3 is a circuit diagram illustrating a voltage pumping device in accordance with one embodiment of the present invention.

FIG. 3 is a circuit diagram illustrating a voltage pumping device in accordance with one embodiment of the present invention.

As shown in FIG. 3, the voltage pumping device in accordance with the present invention includes a power supply circuit 500 for outputting a voltage signal Vpup charged in a capacitor C100 by an internal power supply voltage Vperi in response to a signal generated by dividing an external power supply voltage Vdd; an oscillator 200 for receiving the voltage signal Vpup as a source voltage for a chain of inverters IN1 to IN6 and being operated in response to a high-voltage pumping enable signal ppe; a pump controller 300 for outputting pump drive control signals p1, p2, g1 and g2 in response to a pulse signal osc1 applied from the oscillator 200; and a high-voltage pump 400 for pumping a voltage with a predetermined voltage level in response to the pump drive control signals p1, p2, g1 and g2.

The power supply circuit 500 is a circuit for supplying the power supply voltage to the chain of inverters IN1 to IN6 provided in the oscillator 200. The power supply circuit 500 includes a voltage divider for dividing a voltage between an external power supply (Vdd) and ground (Vss); a P-channel Metal Oxide Semiconductor (PMOS) transistor P300 controlled by a signal of the voltage divided by the voltage divider serving as a driver for supplying the internal power supply voltage Vperi; and a capacitor C100 coupled between the PMOS transistor P300 and the ground (Vss). The voltage divider includes a PMOS diode P11, resistors R1 and R2 and an N-channel Metal Oxide Semiconductor (NMOS) diode N11.

Figure 4:
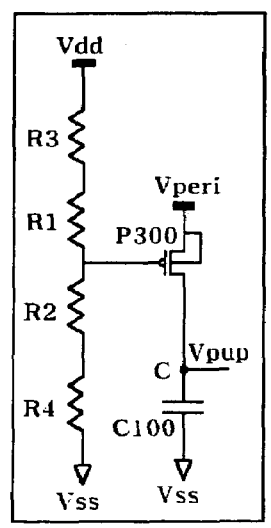
FIGS. 4 to 7 show a power supply circuit for an oscillator in accordance with one embodiment of the present invention, respectively.
Figure 5:
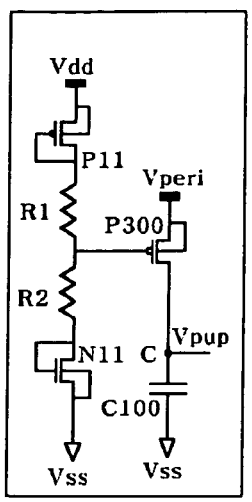
Figure 6:
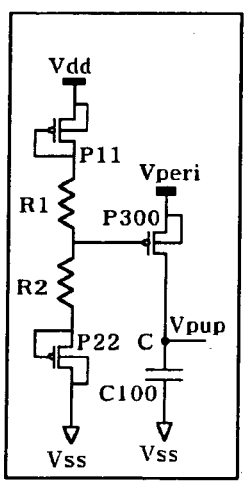
Figure 7:
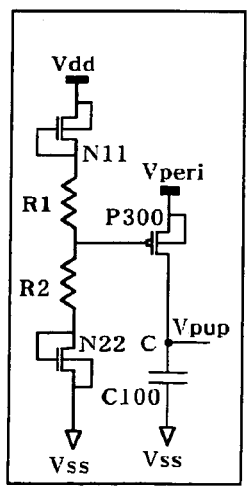
Figure 8:
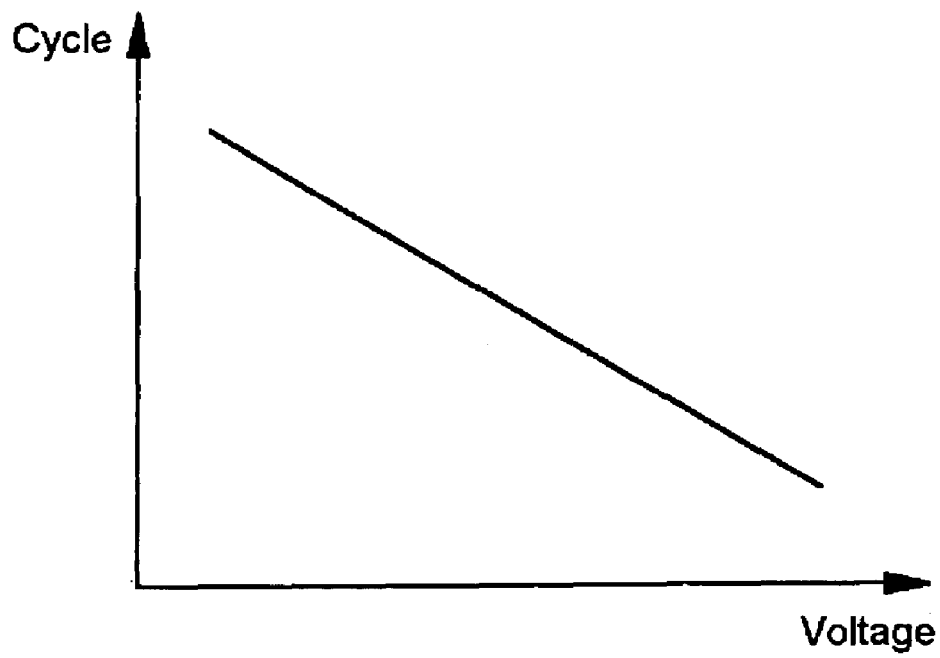
FIG. 8 is a graph illustrating the relationship between a voltage Vs of a pulse signal outputted from the oscillator of the conventional voltage pumping device and a pulse signal cycle.

Alternatively, the voltage divider can include resistors R1 to R4 as shown in FIG. 4. Alternatively, the voltage divider can include a PMOS diode P11, resistors R1 and R2 and a PMOS diode P22 as shown in FIG. 6. Alternatively, the voltage divider can include an NMOS diode N11, resistors R1 and R2 and an NMOS diode N22 as shown in FIG. 7.

Operation associated with a voltage pumping device and a power supply circuit using the same in accordance with one embodiment of the present invention will now be described.

The oscillator 200 generates a predetermined pulse signal osc1 in response to a high-voltage pumping enable signal ppe supplied from a high-voltage level detector (not shown). At this point, a source voltage used in the oscillator 200 is a predetermined voltage signal Vpup supplied from the power supply circuit 500.

When an external power supply voltage Vdd is applied to the power supply circuit 500 for the oscillator, a signal of the external power supply voltage Vdd is divided by a voltage divider constituted by resistors R1 and R2 serving as resistance components, a PMOS diode P11 and an NMOS diode N11. The divided voltage signal is supplied to a gate of a PMOS transistor P300 serving as a driver supplying the internal power supply voltage Vperi with a predetermined voltage level. The internal power supply voltage Vperi is supplied to a capacitor C100 coupled between the PMOS transistor P300 and the ground (Vss), such that the capacitor C100 is charged. That is, the charged voltage Vpup of the capacitor C100 is determined by an amount of charge supplied via the PMOS transistor P300.

At this point, when a value of the external power supply voltage Vdd is increased, a voltage level of the divided voltage signal is increased. The voltage signal with the increased voltage level causes the gate of the PMOS transistor P300 to be less opened, such that an amount of charge supplied via the PMOS transistor P300 from the internal power supply. voltage Vperi is reduced. Subsequently, the reduced amount of charge is supplied and charged in the capacitor C100. The charged voltage Vpup is reduced according to the reduced amount of charge. Thus, as the level of the external power supply voltage Vdd is increased, the power supply circuit 500 for the oscillator can supply a low charged voltage Vpup to the oscillator 200.

Figure 9:
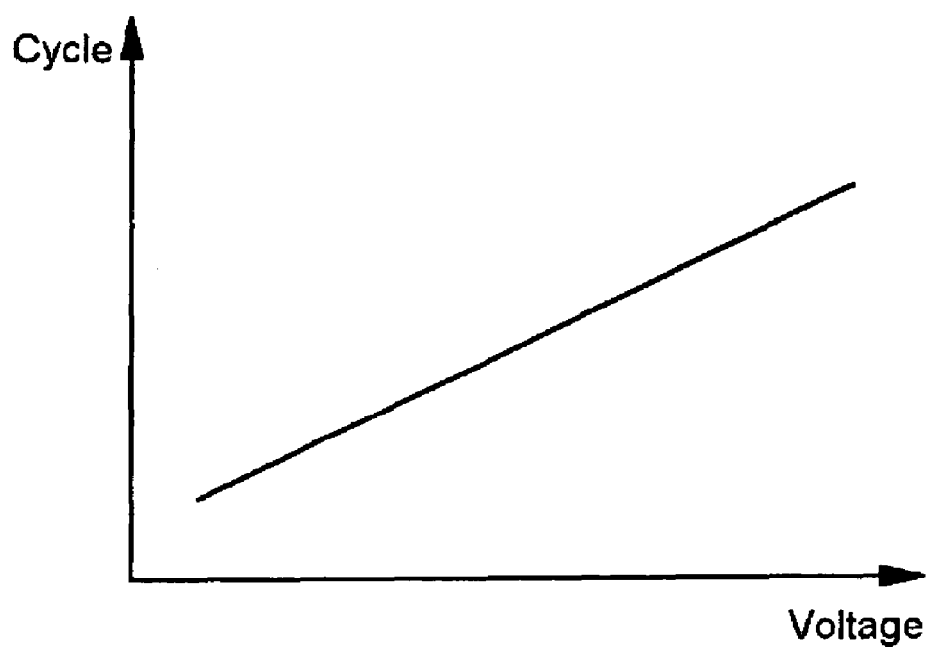
FIG. 9 is a graph illustrating the relationship between a voltage Vs of a pulse signal outputted from the oscillator of the inventive voltage pumping device and a pulse signal cycle.

Subsequently, the oscillator 200 generates a pulse signal osc1 with a predetermined cycle length in response to a high-voltage pumping enable signal ppe supplied from a high-voltage level detector (not shown). At this point, an operating rate of a chain of inverters IN1 to IN6 is reduced as a power supply voltage is reduced. As the external power supply voltage Vdd is increased, the oscillator 200 receives the reduced charged voltage Vpup and generates a pulse signal osc1 with an increased cycle length. FIG. 9 is a graph illustrating the relationship between a voltage Vs of a pulse signal outputted from the oscillator 200 of the inventive voltage pumping device and a pulse signal cycle. As the external power supply voltage Vdd is increased, it is seen that a cycle length of the pulse signal osc1 oscillated by the oscillator 200 is increased.

Subsequently, the pump controller 300 outputs the pump drive control signals p1, p2, g1 and g2 in response to the pulse signal osc1 applied from the oscillator 200. The high-voltage pump 400 performs a function for pumping a high voltage Vpp with a predetermined voltage level in response to the pump drive control signals p1, p2, g1 and g2. A mechanism associated with a pumping operation of the high-voltage pump 400 is the same as the conventional pumping mechanism. That is, when an input terminal of a capacitor C3 is coupled to a high level signal by the pump drive control signal g1, an NMOS transistor N100 is turned on and a node A is driven at the external power supply voltage Vdd. Subsequently, when an input terminal of a capacitor C1 is coupled to a high level signal by the pump drive control signal p1, a voltage at the node A is raised to a targeted high-voltage level. Subsequently, as the pump drive control signal p2 is a low level signal and the pump drive control signal g2 is a high level signal, an NMOS transistor N200 is turned on and a node B is driven at the external power supply voltage Vdd, such that the PMOS transistor P100 is turned on and the voltage at the node A is transferred to a high-voltage (Vpp) node.

Unlike the conventional voltage pumping device, the voltage pumping device in accordance with the present invention increases a pumping cycle length by increasing a cycle length of a pulse signal when the external power supply voltage Vdd is increased. Thus, the voltage pumping device in accordance with the present invention can avoid a phenomenon in which a voltage at the high-voltage (Vpp) node is higher than the targeted voltage level due to over-pumping, thereby performing a stable pumping operation.

In accordance with the present invention, because a relatively low charged voltage Vpup is supplied to the oscillator using the power supply circuit 500 for the oscillator even though the external power supply voltage Vdd is increased, the oscillator 200 can generate a pulse signal osc1 with the increased cycle length to supply the generated pulse signal osc1 to the pump controller 300. Thus, the high-voltage pump 400 receives the pump drive control signals p1, p2, g1 and g2 based on the pulse signal osc1 with the increased cycle length and performs a stable high-voltage pumping operation without over-pumping. Moreover, the voltage pumping device in accordance with the present invention can reduce average current consumption according to the increased cycle length. As an amount of voltage to be pumped at one time is reduced, the effects of noise can be avoided.

The voltage pumping device for generating a voltage Vpp has been described in the above-described embodiment. Furthermore the power supply circuit for the oscillator and the voltage pumping device using the same can be usefully utilized to pump a Vbb voltage.

Furthermore, the power supply circuit for the oscillator can be used for supplying a source voltage to any device in which the oscillator is used as well as the above-described voltage pumping device. For example, when a retention time of cell data under an external high power supply voltage Vdd in a Dynamic Random Access Memory (DRAM) needs to be increased so that electric current consumption can be reduced, the present invention can be used as a power supply circuit for an oscillator that can increase a self refresh cycle under the external high power supply voltage Vdd.

As apparent from the above description, the present invention can avoid an excessive increase in an internal power supply voltage due to over-pumping and reduce noise occurrence and electric current consumption by supplying a relatively low voltage to an oscillator to increase a cycle length of an output pulse signal of the oscillator as a level of an external power supply voltage is increased.

What is claimed is:

1. A power supply circuit for an oscillator, comprising:
an internal power supply source for supplying an internal power supply voltage with a predetermined level;
a voltage divider for dividing a voltage between an external power supply and ground;
a driver being a P-channel Metal Oxide Semiconductor (PMOS) transistor connected between the internal power supply source and an output node of an internal voltage, whereby the P-channel Metal Oxide Semiconductor (PMOS) transistor is turned on by receiving directly a signal of the voltage divided by the voltage divider; and
a capacitor coupled between the output node and the ground,
wherein the internal voltage is a source voltage for a chain of inverters arranged within the oscillator and the oscillator generates a pulse signal with an increased cycle length as the external power supply voltage is increased.

2. The power supply circuit of claim 1, wherein a level of the voltage supplied by the power supply circuit for the oscillator is based on a magnitude of a voltage charged in the capacitor according to the internal power supply voltage driven by the driver.

3. The power supply circuit of claim 1, wherein the voltage divider comprises a first resistance component and a second resistance component coupled between the external power supply and the ground.

4. The power supply circuit of claim 3, wherein the voltage divider further comprises a first diode and a second diode coupled between the external power supply and the ground.

5. The power supply circuit of claim 4, wherein the first diode is a P-channel Metal Oxide Semiconductor (PMOS) diode and wherein the second diode is an N- channel Metal Oxide Semiconductor (NMOS) diode.

6. The power supply circuit of claim 4, wherein the first diode is a first N-channel Metal Oxide Semiconductor (NMOS) diode and wherein the second diode is a second NMOS diode.

7. The power supply circuit of claim 4, wherein the first diode is a first P-channel Metal Oxide Semiconductor (PMOS) diode and wherein the second diode is a second PMOS diode.

8. A voltage pumping device, comprising:
a power supply circuit comprising a internal power supply source for supplying an internal power supply voltage with a predetermined level, a voltage divider for dividing a voltage between an external power supply and ground, a driver being a P-channel Metal Oxide Semiconductor (PMOS) transistor connected between the internal power supply source and a output node of an internal voltage and a capacitor coupled between the output node and the ground, whereby the P-channel Metal Oxide Semiconductor PMOS transistor is turned on to supply an internal voltage by receiving directly a signal of the voltage divided by the voltage divider and a capacitor coupled between the output node and the ground;
an oscillator for receiving the internal voltage as a source voltage and being operated in response to a high-voltage pumping enable signal;
a pump controller for outputting pump drive control signals according to a pulse signal applied from the oscillator; and
a high-voltage pump for pumping a voltage with a predetermined voltage level according to the pump drive control signals
wherein the oscillator generates a pulse signal with an increased cycle length as the external power supply voltage is increased.

9. The voltage pumping device of claim 8, wherein a voltage level of the internal voltage is based on a magnitude of a voltage charged in the capacitor according to the internal power supply voltage driven by the driver.

10. The voltage pumping device of claim 8, wherein the voltage divider comprises a first resistance component and a second resistance component coupled between the external power supply and the ground.

11. The voltage pumping device of claim 10, wherein the voltage divider further comprises a first diode and a second diode coupled between the external power supply and the ground.

12. The voltage pumping device of claim 11, wherein the first diode is a P-channel Metal Oxide Semiconductor (PMOS) diode and wherein the second diode is an N-channel Metal Oxide Semiconductor (NMOS) diode.

13. The voltage pumping device of claim 11, wherein the first diode is a first N-channel Metal Oxide Semiconductor (NMOS) diode and wherein the second diode is a second NMOS diode.

14. The voltage pumping device of claim 11, wherein the first diode is a first P-channel Metal Oxide Semiconductor (PMOS) diode and wherein the second diode is a second PMOS diode.

* * * * *